US010622147B2

(12) United States Patent
Son et al.

(10) Patent No.: US 10,622,147 B2
(45) Date of Patent: Apr. 14, 2020

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Soo Hwan Son, Suwon-si (KR); Jong Duck Kim, Suwon-si (KR); Dae Heon Jeong, Suwon-si (KR); Ho Yoon Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 61 days.

(21) Appl. No.: 16/001,338

(22) Filed: Jun. 6, 2018

(65) Prior Publication Data

US 2019/0066919 A1 Feb. 28, 2019

(30) Foreign Application Priority Data

Aug. 29, 2017 (KR) .......................... 10-2017-0109472

(51) Int. Cl.
H01G 4/12 (2006.01)
H01G 4/30 (2006.01)
(Continued)

(52) U.S. Cl.
CPC ................. *H01G 4/12* (2013.01); *H01G 2/06* (2013.01); *H01G 2/065* (2013.01); *H01G 4/005* (2013.01);
(Continued)

(58) Field of Classification Search
CPC ............. H01G 4/232; H01G 4/40; H01G 4/30
(Continued)

(56) References Cited

U.S. PATENT DOCUMENTS

2004/0066589 A1 4/2004 Togashi et al.
2005/0194575 A1 9/2005 Satou
(Continued)

FOREIGN PATENT DOCUMENTS

CN 1661740 A 8/2005
CN 1808649 A 7/2006
(Continued)

OTHER PUBLICATIONS

Office Action issued in corresponding Chinese Patent Application No. 201810953546.7 dated Jan. 17, 2020, with English translation.

*Primary Examiner* — Michael P McFadden
(74) *Attorney, Agent, or Firm* — Morgan, Lewis & Bockius LLP

(57) ABSTRACT

A composite electronic component includes a composite body that includes a multilayer ceramic capacitor and a ceramic chip coupled to each other. The multilayer ceramic capacitor includes a first ceramic body in which a plurality of dielectric layers and internal electrodes disposed to face each other with respective dielectric layers interposed therebetween are stacked, and first and second external electrodes are disposed on both end portions of the first ceramic body. The ceramic chip is disposed on a lower portion of the multilayer ceramic capacitor and includes a second ceramic body and first and second terminal electrodes disposed on both end portions of the second ceramic body and connected to the first and second external electrodes, respectively. A plurality of electrodes are disposed in the second ceramic body.

23 Claims, 8 Drawing Sheets

(51) Int. Cl.
*H01G 2/06* (2006.01)
*H01G 4/005* (2006.01)
*H01G 4/012* (2006.01)
*H05K 1/18* (2006.01)
*H01G 4/38* (2006.01)

(52) U.S. Cl.
CPC .............. *H01G 4/012* (2013.01); *H01G 4/30* (2013.01); *H01G 4/38* (2013.01); *H05K 1/181* (2013.01)

(58) Field of Classification Search
USPC ........................................................ 361/301.4
See application file for complete search history.

(56) References Cited

U.S. PATENT DOCUMENTS

| | | |
|---|---|---|
| 2006/0158827 A1 | 7/2006 | Lee et al. |
| 2008/0186652 A1 | 8/2008 | Lee et al. |
| 2010/0066479 A1* | 3/2010 | Tanaka ................ H01C 7/10 338/20 |
| 2013/0083448 A1 | 4/2013 | Chung et al. |
| 2013/0329388 A1 | 12/2013 | Dogauchi |
| 2014/0284089 A1 | 9/2014 | Hattori et al. |
| 2016/0133386 A1 | 5/2016 | Park et al. |
| 2016/0142033 A1* | 5/2016 | Chong ................ H01G 4/30 333/185 |
| 2016/0189868 A1 | 6/2016 | Sasaki et al. |
| 2016/0343504 A1* | 11/2016 | Ando ................ H01G 2/16 |
| 2016/0351333 A1* | 12/2016 | Ando ................ H01G 4/40 |
| 2018/0122578 A1* | 5/2018 | Choi ................ H01G 2/06 |

FOREIGN PATENT DOCUMENTS

| | | |
|---|---|---|
| CN | 101241800 A | 8/2008 |
| CN | 103035406 A | 4/2013 |
| CN | 103489632 A | 1/2014 |
| CN | 104810152 A | 7/2015 |
| CN | 106206017 A | 12/2016 |
| JP | 2004-134430 A | 4/2004 |
| JP | 2010-161172 A | 7/2010 |
| JP | 5012658 B2 | 8/2012 |
| JP | 2014-207422 A | 10/2014 |
| JP | 2016-127045 A | 7/2016 |
| KR | 2016-0055424 A | 5/2016 |

* cited by examiner

COMPOSITE ELECTRONIC COMPONENT AND BOARD HAVING THE SAME

CROSS-REFERENCE TO RELATED APPLICATION(S)

This application claims benefit of priority to Korean Patent Application No. 10-2017-0109472 filed on Aug. 29, 2017 in the Korean Intellectual Property Office, the disclosure of which is incorporated herein by reference in its entirety.

BACKGROUND

1. Field

The present disclosure relates to a composite electronic component and a board having the same.

2. Description of Related Art

A multilayer ceramic capacitor is a type of multilayer electronic component, and is a chip type condenser commonly mounted on the circuit boards of various electronic products, including display devices such as liquid crystal displays (LCDs), plasma display panels (PDPs), and the like, computers, personal digital assistants (PDAs), mobile phones, and the like. The multilayer ceramic capacitor typically serves to charge or discharge electricity.

The multilayer ceramic capacitor (MLCC) may be used as a component in various electronic apparatuses due to advantages thereof such as a small size, high capacitance, and case of mountability.

The multilayer ceramic capacitor may have a structure in which a plurality of dielectric layers are provided, and internal electrodes with different polarities are alternately stacked between the dielectric layers.

Since the dielectric layer as described above has piezoelectric and electrostrictive properties, when a direct current (DC) or alternating current (AC) voltage is applied to the multilayer ceramic capacitor, a piezoelectric phenomenon may occur between the internal electrodes, thereby generating vibrations.

These vibrations are transferred to a circuit board on which the multilayer ceramic capacitor is mounted through external electrodes of the multilayer ceramic capacitor, such that an entire circuit board can become a sound reflecting surface that transmits the sound of vibrations as noise.

The sound of vibrations may correspond to an audio frequency within a range of 20 to 20,000 Hz potentially causing user discomfort. The vibration noise causing listener discomfort as described above is known as acoustic noise.

In accordance with the recent trend for slimness and miniaturization of electronic devices, the multilayer ceramic capacitor has been used together with a printed circuit board in high voltage and large voltage change environments, and thus, such acoustic noise may be experienced by a user.

Therefore, a novel product capable of decreasing acoustic noise has been continuously demanded.

Meanwhile, research into a composite electronic component in which a printed circuit board is used below a multilayer ceramic capacitor in order to decrease acoustic noise has been conducted.

However, in this case, acoustic noise may be decreased, but since a current path may be extended when an alternating current voltage is applied, a side effect that equivalent series inductance (ESL) is increased may occur.

SUMMARY

An aspect of the present disclosure may provide a composite electronic component capable of simultaneously decreasing acoustic noise and ESL, and a board having the same.

According to an aspect of the present disclosure, a composite electronic component may include a composite body that includes a multilayer ceramic capacitor and a ceramic chip. The multilayer ceramic capacitor includes a first ceramic body in which a plurality of dielectric layers and internal electrodes disposed to face each other with respective dielectric layers interposed therebetween are stacked, and first and second external electrodes are disposed on both end portions of the first ceramic body. The ceramic chip is coupled to the multilayer ceramic capacitor, is disposed on a lower portion of the multilayer ceramic capacitor, and includes a second ceramic body and first and second terminal electrodes disposed on both end portions of the second ceramic body and connected to the first and second external electrodes, respectively. A plurality of electrodes are disposed in the second ceramic body.

The second ceramic body may contain a paraelectric material.

According to another aspect of the present disclosure, a board having a composite electronic component may include a printed circuit board on which a plurality of electrode pads are disposed, the composite electronic component as described above mounted on the printed circuit board, and a solder connecting the electrode pads and the composite electronic component to each other.

According to a further aspect of the present disclosure, a composite electronic component may include a multilayer ceramic capacitor and a ceramic chip. The multilayer ceramic capacitor includes first and second internal electrodes alternately stacked to overlap with each other in a ceramic body. The ceramic chip has the multilayer ceramic capacitor mounted to a first surface thereof, and includes a plurality of planar electrodes disposed therein and overlapping with each other. The composite electronic component has a mounting surface for mounting to a printed circuit board, and the mounting surface is a second surface of the ceramic chip that is disposed opposite the first surface of the ceramic chip on which the multilayer ceramic capacitor is mounted.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments will be described in detail with reference to the accompanying drawings.

Composite Electronic Component

Figure 1:
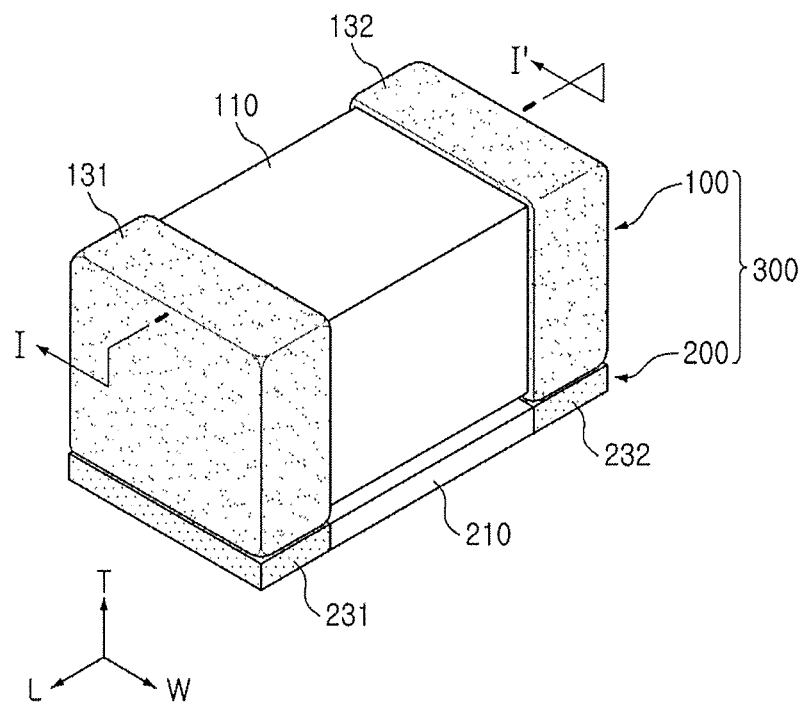
FIG. 1 is a perspective view schematically illustrating a composite electronic component according to a first exemplary embodiment.

FIG. 1 is a perspective view schematically illustrating a composite electronic component according to a first exemplary embodiment.

Figure 2:
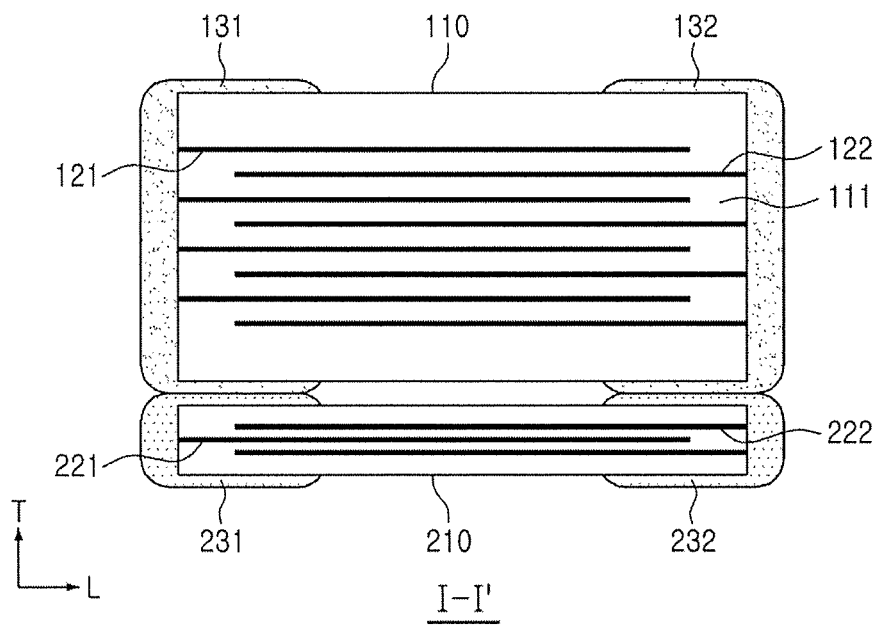
FIG. 2 is a cross-sectional view taken along line I-I' of FIG. 1.

FIG. 2 is a cross-sectional view taken along line I-I' of FIG. 1.

Referring to FIG. 1, in the composite electronic component according to the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers of a capacitor are stacked, that is, a 'stacking direction'.

Meanwhile, in the exemplary embodiment, the composite electronic component may have upper and lower surfaces opposing each other, first and second end surfaces opposite each other in the length direction and third and fourth side surfaces opposite each other in the width direction that connect the upper and lower surfaces to each other. A shape of the composite electronic component is not particularly limited, but may be a hexahedral shape as illustrated.

In addition, the first and second end surfaces of the composite electronic component opposite each other in the length direction may be referred to as surfaces in the same directions as directions of first and second end surfaces of the multilayer ceramic capacitor and the ceramic chip opposite each other in the length direction. The third and fourth side surfaces of the composite electronic component opposite each other in the width direction may be referred to as third and fourth side surfaces of the multilayer ceramic capacitor and the ceramic chip opposite each other in the width direction, respectively, as described below.

Meanwhile, in the composite electronic component, the multilayer ceramic capacitor and the ceramic chip may be coupled to each other, and in a case in which the ceramic chip is coupled to a lower portion of the multilayer ceramic capacitor, the upper surface of the composite electronic component may be defined as an upper surface of the multilayer ceramic capacitor, and a lower surface of the composite electronic component may be defined as a lower surface of the ceramic chip.

Referring to FIGS. 1 and 2, the composite electronic component according to the first exemplary embodiment may include a composite body 300 in which a multilayer ceramic capacitor 100 and a ceramic chip 200 are coupled to each other. The multilayer ceramic capacitor 100 includes a first ceramic body 110 in which a plurality of dielectric layers 111 and internal electrodes 121 and 122 disposed to face each other with respective dielectric layers 111 interposed therebetween are stacked and first and second external electrodes 131 and 132 disposed on both end portions of the first ceramic body 110. The ceramic chip 200 is disposed on a lower portion or surface of the multilayer ceramic capacitor 100 and includes a second ceramic body 210 and first and second terminal electrodes 231 and 232 disposed on both end portions of the second ceramic body 210 and connected to the first and second external electrodes 131 and 132, respectively.

According to the exemplary embodiment, a plurality of electrodes 221 and 222 may be disposed in the second ceramic body 210.

According to the related art, research into a composite electronic component in which a printed circuit board was used on a lower surface of a multilayer ceramic capacitor in order to decrease acoustic noise has been conducted.

However, in a case of using the printed circuit board on a lower surface of the multilayer ceramic capacitor, acoustic noise may be decreased, but since a current path is extended corresponding to a thickness of the printed circuit board when an alternating current voltage is applied, a side effect in which equivalent series inductance (ESL) is increased may occur.

According to the exemplary embodiment, the ceramic chip 200 may be disposed on the lower portion of the multilayer ceramic capacitor 100 in order to decrease acoustic noise, but the plurality of electrodes 221 and 222 may be disposed in the second ceramic body 210, such that a current path may be shortened, thereby decreasing acoustic noise without an increase in ESL.

More specifically, the plurality of electrodes 221 and 222 may be composed of a first electrode 221 connected to the first terminal electrode 231 of the ceramic chip 200 and a second electrode 222 connected to the second terminal electrode 232.

The numbers of first and second electrodes 221 and 222 stacked in the second ceramic body 210 are not particularly limited, but may each be at least one. That is, a total of at least 2 electrodes may be stacked in the second ceramic body 210, and the number of stacked first and second electrodes 221 and 222 may be suitably adjusted. Although a case in which the number of first electrode 221 is one and the number of second electrode 222 is two is illustrated in FIG. 2, the numbers of first and second electrodes 221 and 222 are not necessarily limited thereto.

The first electrode 221 may be exposed to one surface of the second ceramic body 210, and more specifically to a first end surface thereof in the length direction, to thereby be connected to the first terminal electrode 231. The second electrode 222 may be exposed to the other surface of the second ceramic body 210, and more specifically to a second end surface thereof in the length direction, to thereby be connected to the second terminal electrode 232.

The first and second terminal electrodes 231 and 232 of the ceramic chip 200 may be connected to the first and second external electrodes 131 and 132 of the multilayer ceramic capacitor 100, respectively.

According to the related art, there is a problem in that when an alternating current voltage is applied, since a current path is extended by a distance corresponding to a thickness of a printed circuit board, equivalent series inductance (ESL) is increased. However, according to the exemplary embodiment, since the current path is formed along the first and second electrodes 221 and 222 disposed in the ceramic chip 200 mounted on a printed circuit board while directly coming in contact with a mounting surface of the printed circuit board, acoustic noise may be decreased without an increase in ESL, unlike the composite electronic component according to the related art.

Hereinafter, the multilayer ceramic capacitor 100 and the ceramic chip 200 configuring the composite body 300 will be described in detail.

Referring to FIG. 2, the first ceramic body 110 configuring the multilayer ceramic capacitor 100 may be formed by stacking the plurality of dielectric layers 111, and a plurality of internal electrodes 121 and 122 (sequentially first and second internal electrodes) may be disposed in the first ceramic body 110 to be separated from each other with respective dielectric layers 111 interposed therebetween.

The plurality of dielectric layers 111 configuring the first ceramic body 110 may be in a sintered state, and adjacent dielectric layers 111 may be integrated with each other so that boundaries therebetween are not readily apparent.

The dielectric layer 111 may be formed by sintering a ceramic green sheet containing a ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

That is, the dielectric layer 111 configuring the first ceramic body 110 may contain a ferroelectric material, but is not necessarily limited thereto.

Meanwhile, according to the first exemplary embodiment, the internal electrodes may include first internal electrodes 121 exposed to a first end surface of the composite body 300 in the length direction and second internal electrodes 122 exposed to a second end surface thereof in the length direction, but the internal electrodes are not limited thereto.

The first and second internal electrodes 121 and 122 may be formed of a conductive paste containing a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layers 111, using the conductive paste by a printing method such as screen printing method or a gravure printing method.

The first ceramic body 110 may be formed by alternately stacking and sintering the ceramic green sheets on which the internal electrode is printed.

The plurality of first and second internal electrodes 121 and 122 may be disposed to be horizontal (e.g., parallel) relative to the upper and lower surfaces of the first ceramic body 110.

Meanwhile, the first and second external electrodes 131 and 132 may be formed of a conductive paste including a conductive metal, wherein the conductive metal may be nickel (Ni), copper (Cu), palladium (Pd), gold (Au), or alloys thereof, but is not limited thereto.

Further, nickel/tin (Ni/Sn) plating layers may be further disposed on the first and second external electrodes 131 and 132.

According to the first exemplary embodiment, the ceramic chip 200 may be coupled to the lower portion of the multilayer ceramic capacitor 100 to thereby be disposed thereon.

In the ceramic chip 200, the first and second terminal electrodes 231 and 232 connected to the first and second external electrodes 131 and 132 may be disposed on both end portions of the second ceramic body 210 formed of a bulk shaped ceramic material.

In general, in order to significantly decrease the transferring of vibration of a multilayer ceramic capacitor to a printed circuit board, there was an attempt to insert an intermediate medium between the multilayer ceramic capacitor and the printed circuit board.

However, since the intermediate medium is formed of a material having elasticity as a resin generally used to manufacture a printed circuit board, the intermediate medium may serve to absorb vibrations of the multilayer ceramic capacitor through elasticity of the intermediate medium.

On the contrary, according to the first exemplary embodiment described herein, since the second ceramic body 210 of the ceramic chip 200 is formed of only a hard ceramic material that is not elastically deformed, the printed circuit board and the multilayer ceramic capacitor 100 may be spaced apart from each other by the ceramic chip 200, thereby blocking vibration itself generated in the multilayer ceramic capacitor 100 from being transferred.

According to the first exemplary embodiment, the second ceramic body 210 may contain a paraelectric material, but is not necessarily limited thereto.

Since the paraelectric material does not have piezoelectric properties, the paraelectric material may suppress vibrations generated in the multilayer ceramic capacitor 100 from being transferred, such that the ceramic chip 200 including the second ceramic body 210 containing the paraelectric material is disposed on the lower portion of the multilayer ceramic capacitor 100 to decrease acoustic noise.

Further, in a case in which the second ceramic body 210 of the ceramic chip 200 is formed of the paraelectric material, it may be easy to dispose the plurality of electrodes 221 and 222 in the second ceramic body 210, such that the composite electronic component is capable of decreasing acoustic noise without an increase in ESL, unlike the composite electronic component according to the related art.

That is, in a case in which the resin, alumina ($Al_2O_3$), or the like, generally used to manufacture a printed circuit board is used in the intermediate medium as in the related art, it may be difficult to insert electrodes into the intermediate medium, such that it may not be easy to implement a structure according to the present disclosure.

The paraelectric material is not particularly limited as long as it has paraelectric properties. For example, the paraelectric material may be a material represented by $(Ca_{1-x}Sr_x)(Zr_{1-y}Ti_y)O_3$, $Ca(Zr_{1-y}Ti_y)O_3$, $Sr(Zr_{1-y}Ti_y)O_3$, $(Ca_{1-x}Sr_x)ZrO_3$, and $(Ca_{1-x}Sr_x)TiO_3$.

According to another exemplary embodiment, a ceramic material configuring the second ceramic body 210 may be the same as that contained in the first ceramic body 110 configuring the multilayer ceramic capacitor 100.

That is, the ceramic material configuring the second ceramic body 210, which is a material having high permittivity, may be a barium titanate ($BaTiO_3$) based material, a strontium titanate ($SrTiO_3$) based material, or the like, but is not limited thereto.

That is, the second ceramic body 210 may contain a ferroelectric material.

When the ceramic material configuring the second ceramic body 210 is the same as the ferroelectric material, which is the ceramic material configuring the first ceramic body 110, the ceramic chip 200 may have piezoelectric properties, but since phases of vibration generated in the multilayer ceramic capacitor 100 and vibration generated in the ceramic chip 200 are different from each other, acoustic noise may nonetheless be decreased.

That is, while vibration generated in the multilayer ceramic capacitor 100 is transferred to the ceramic chip 200, a phase of piezoelectric vibration is changed, such that a vibration cancellation effect may be exhibited, thereby decreasing overall acoustic noise.

Further, in a case in which the second ceramic body 210 of the ceramic chip 200 is formed of the same material as the dielectric material configuring the first ceramic body 110 of the multilayer ceramic capacitor 100, it may be easy to dispose the plurality of electrodes 221 and 222 in the second ceramic body 210, such that the composite electronic component capable of decreasing acoustic noise without an increase in ESL, unlike the composite electronic component according to the related art, may be implemented.

Meanwhile, the plurality of electrodes 221 and 222 disposed in the second ceramic body 210, that is, the first and second electrodes 221 and 222 may each be exposed to a respective one of the first and second end surfaces of the second ceramic body 210 in the length direction.

The first and second electrodes 221 and 222 may be formed of a conductive paste containing a conductive metal.

The conductive metal may be nickel (Ni), copper (Cu), palladium (Pd), or alloys thereof, but is not limited thereto.

A method of inserting the first and second electrodes 221 and 222 in the second ceramic body 210 may be performed by printing a conductive paste on a ceramic green sheet using a printing method such as a screen printing method or a gravure printing method, similarly to a method of forming the first and second internal electrodes 121 and 122 in the first ceramic body 110.

That is, the method of inserting the first and second electrodes 221 and 222 in the second ceramic body 210 is similar to a method of forming internal electrodes of a general multilayer ceramic capacitor, such that the first and second electrodes 221 and 222 may be manufactured without a particular difficulty in a manufacturing process.

The second ceramic body 210 may be formed by alternately stacking and sintering ceramic green sheets on which one of the first and second internal electrodes is printed.

The first and second electrodes 221 and 222 may be disposed to be horizontal (e.g., parallel) relative to upper and lower surfaces of the second ceramic body 210, but is not necessarily limited thereto. That is, the first and second electrodes 221 and 222 may be disposed to be perpendicular to the upper and lower surfaces of the second ceramic body 210. When the first and second electrodes 221 and 222 are disposed to be perpendicular to the lower surface of the second ceramic body 210, that is, a mounting surface thereof, an effect of decreasing ESL may be more excellent.

Although not particularly limited, the first and second terminal electrodes 231 and 232 may have, for example, a double layer structure composed of first and second conductive resin layers at inner portions thereof and first and second plating layers at outer portions thereof.

According to the first exemplary embodiment, since the first and second terminal electrodes 231 and 232 have the double layer structure composed of the first and second conductive resin layers at the inner portions thereof and the first and second plating layers at the outer portions thereof, when mechanical stress is applied thereto from the outside, the ceramic chip 200 and the conductive resin layers used as the terminal electrodes 231 and 232 of the ceramic chip 200 may suppress stress from being transferred to the multilayer ceramic capacitor 100, thereby preventing the multilayer ceramic capacitor 100 from being damaged by cracks.

The first and second conductive resin layers may contain a conductive metal and a thermosetting resin, for example, silver (Ag) and an epoxy resin, but are not limited thereto.

Figure 3:
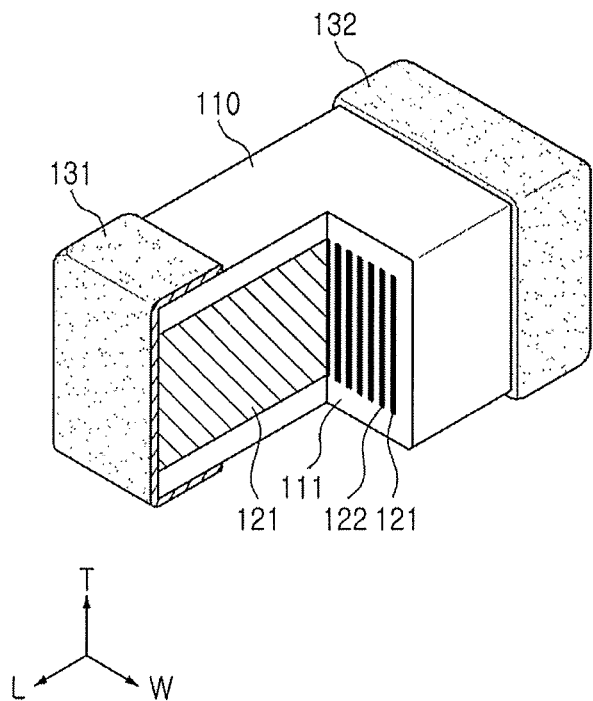
FIG. 3 is a partially cutaway perspective view schematically illustrating a multilayer ceramic capacitor according to a second exemplary embodiment of the composite electronic component of FIG. 1.

FIG. 3 is a partially cutaway perspective view schematically illustrating a multilayer ceramic capacitor according to a second exemplary embodiment in the composite electronic component of FIG. 1.

In the multilayer ceramic capacitor according to the second exemplary embodiment, a plurality of first and second internal electrodes 121 and 122 may be disposed to be perpendicular to upper and lower surfaces of a first ceramic body 110.

That is, the first and second internal electrodes 121 and 122 may be stacked to be perpendicular to a mounting surface of a composite body 300 at the time of mounting the composite body 300 on a printed circuit board.

In general, when a voltage is applied to a multilayer ceramic capacitor, a ceramic body may be repeatedly expanded and contracted in length, width, and thickness directions due to an inverse piezoelectric effect of dielectric layers.

That is, in a case of actually measuring displacement amounts in a multilayer ceramic capacitor in the orientation shown in FIG. 2, displacement amounts of a surface (LW surface) of the ceramic body in a length-width direction (e.g. a surface parallel to internal electrodes 121, 122 of the capacitor), a surface (WT surface) of the ceramic body in a width-thickness direction (e.g., an end surface), and a surface (LT surface) of the ceramic body in a length-thickness direction (e.g., a side surface) using a laser doppler vibrometer (LDV), the displacement amount is decreased in a sequence of the LW surface, the WT surface, and the LT surface.

The displacement amount of the LT surface is about 42% or so, based on that of the WT surface, such that the displacement amount of the LT surface may be smaller than that of the WT surface. The reason may be that stress having the same magnitude is generated in the LT surface and the WT surface, but particularly, since the LT surface has a relatively wide area as compared to the WT surface, stress having a similar magnitude may be distributed throughout the wide area, such that relatively small deformation may occur.

Therefore, it may be appreciated that in the general multilayer ceramic capacitor, the displacement amount is the smallest in the LT surface.

That is, according to the second exemplary embodiment, the first and second internal electrodes 121 and 122 may be stacked to be perpendicular to the upper and lower surfaces of the first ceramic body 110, such that at the time of mounting the composite body 300 on the printed circuit board, the first and second internal electrodes 121 and 122 may be disposed to be perpendicular to the mounting surface, thereby significantly decreasing a vibration amount of a surface of the first ceramic body 110 coming in contact with the ceramic chip 200.

Figure 4:
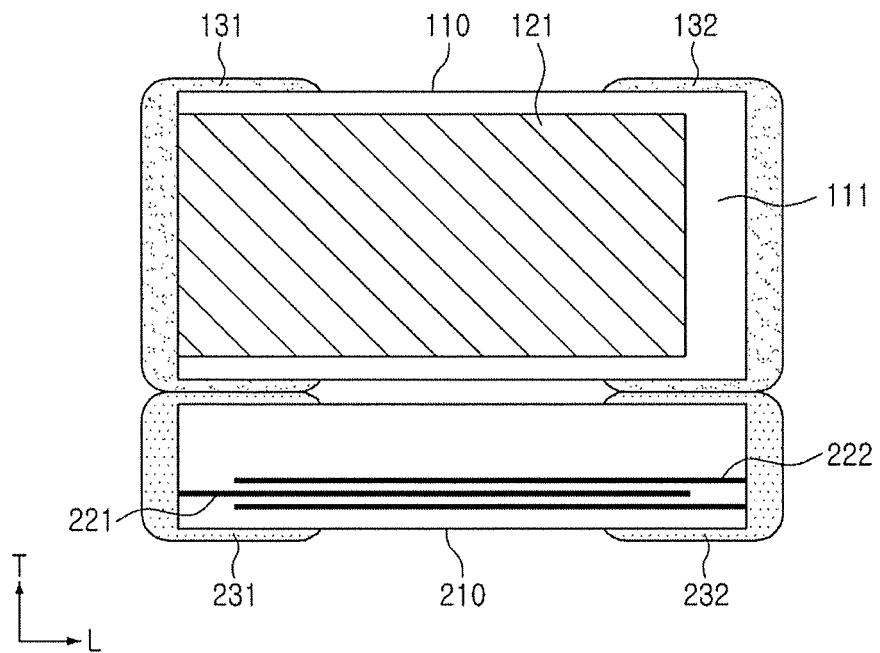
FIG. 4 is a cross-sectional diagram taken along the line I-I' of FIG. 1 according to a third exemplary embodiment.

FIG. 4 is a cross-sectional diagram taken along the line I-I' of FIG. 1 according to a third exemplary embodiment.

Referring to FIG. 4, in the composite electronic component according to the third exemplary embodiment, a plurality of electrodes 221 and 222 disposed in a second ceramic body 210 may be disposed to be adjacent to a mounting surface of a composite body.

The first and second electrodes 221 and 222 may be disposed to be horizontal (e.g., parallel) relative to upper and lower surfaces of the second ceramic body 210 and be adjacent to the mounting surface of the composite body, such that even though a thickness of the ceramic chip 200 is increased in order to increase an effect of decreasing acoustic noise, ESL may not be increased.

Generally, when a ceramic chip is disposed on a lower surface of a multilayer ceramic capacitor, an effect of decreasing acoustic noise is increased in proportion to a thickness of the ceramic chip. However, in a case of increasing the thickness of the ceramic chip in order to increase the effect of decreasing acoustic noise, a current path may be further extended, such that ESL may be increased.

According to the third exemplary embodiment, a current path may not be extended by disposing the plurality of electrodes 221 and 222 disposed in the second ceramic body 210 to be adjacent to the mounting surface of the composite body 300 in the case of increasing the thickness of the ceramic chip in order to increase the effect of decreasing acoustic noise. Therefore, ESL may also not be increased.

More specifically, in an internal structure of the second ceramic body 210 according to the third exemplary embodiment, a thickness of an upper ceramic region (e.g., above an uppermost internal electrode among the first and second internal electrodes 221 and 222) may be thicker than that of a lower ceramic region (e.g., below a lowermost internal electrode among the first and second internal electrodes 221 and 222) based on a position at which the first and second electrodes 221 and 222 are disposed.

That is, since the thickness of the lower ceramic region based on the position at which the first and second electrodes 221 and 222 are disposed is thin, the first and second electrodes 221 and 222 may be disposed to be more adjacent to (e.g., closer to) a printed circuit board (e.g., closer to the printed circuit board than to the capacitor 100), such that the current path may not be extended.

Figure 5:
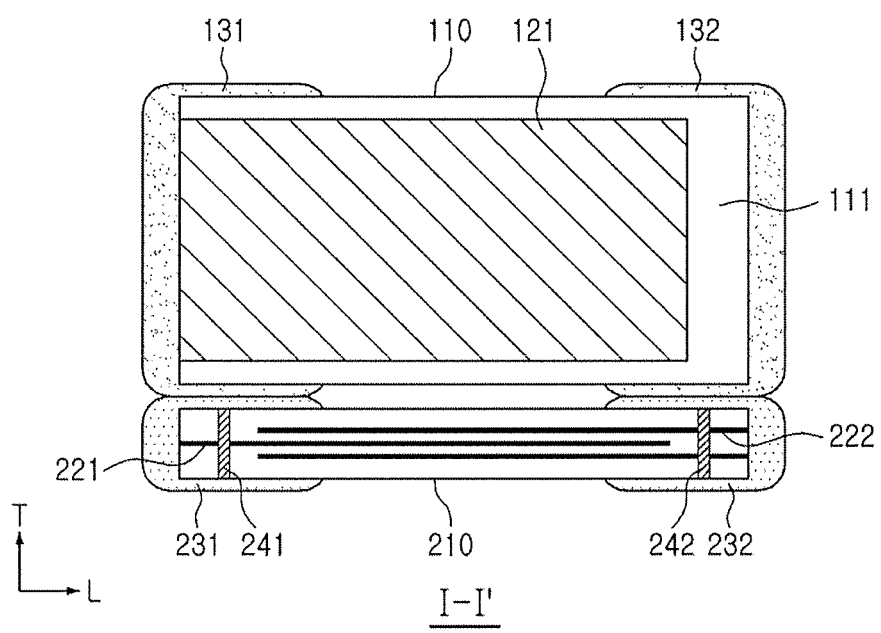
FIG. 5 is a cross-sectional diagram taken along the line I-I' of FIG. 1 according to a fourth exemplary embodiment.

FIG. 5 is a cross-sectional diagram taken along the line I-I' of FIG. 1 according to a fourth exemplary embodiment.

A ceramic chip 200 may further include a first via electrode 241 penetrating through a first electrode 221 to thereby be connected to a first terminal electrode 231, and include a second via electrode 242 penetrating through a second electrode 222 to thereby be connected to a second terminal electrode 232.

According to the fourth exemplary embodiment, in a case of disposing the ceramic chip 200 on a lower portion (or surface) of a multilayer ceramic capacitor 100 in order to decrease acoustic noise, ESL may not be increased by allowing the ceramic chip 200 to further include the first via electrode 241 penetrating through the first electrode 221 to thereby be connected to the first terminal electrode 231, and include the second via electrode 242 penetrating through the second electrode 222 to thereby be connected to the second terminal electrode 232.

More specifically, since the first via electrode 241 penetrating through the first electrode 221 to thereby be connected to the first terminal electrode 231 and the second via electrode 242 penetrating through the second electrode 222 to thereby be connected to the second terminal electrode 232 are further included in an internal structure of the second ceramic body 210 according to the fourth exemplary embodiment, a current path may be formed along the first an second via electrodes 241 and 242. Thus, the current path may be shortened as compared to a structure according to the related art.

Therefore, according to the fourth exemplary embodiment, acoustic noise may be decreased in a state in which ESL is not increased.

Figure 6:
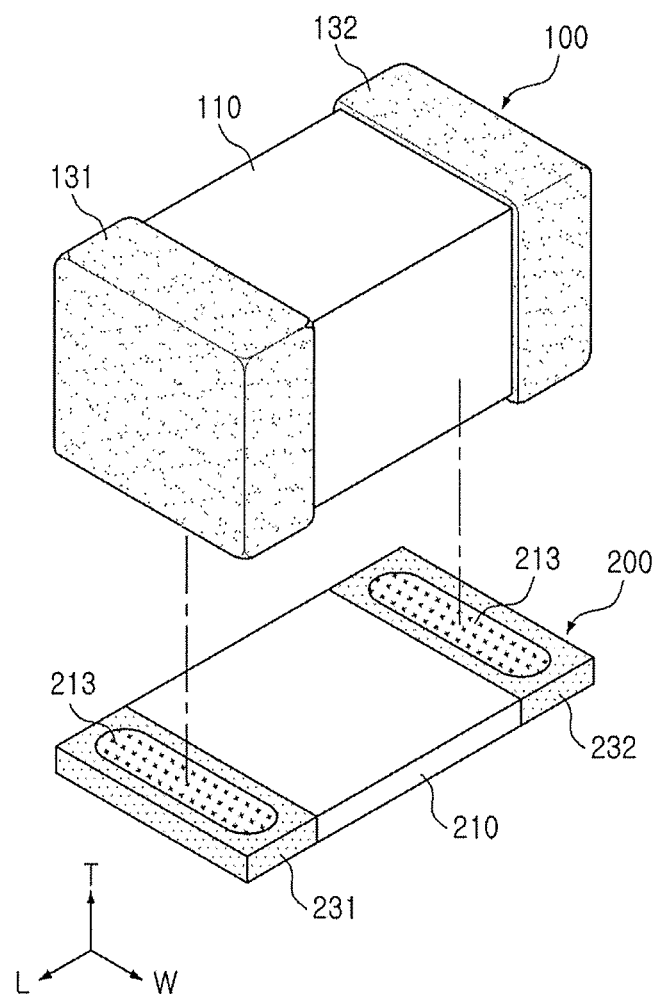
FIG. 6 is an exploded perspective view separately illustrating a multilayer ceramic capacitor and a ceramic chip of the composite electronic component of FIG. 1.

FIG. 6 is an exploded perspective view separately illustrating a multilayer ceramic capacitor and a ceramic chip of the composite electronic component of FIG. 1.

The composite body 300 may be formed by coupling the multilayer ceramic capacitor 100 and the ceramic chip 200 to each other, and a method of forming the composite body 300 is not particularly limited.

The composite body 300 may be formed by coupling the multilayer ceramic capacitor 100 and the ceramic chip 200 that are separately manufactured to each other using a high-melting point solder, a conductive adhesive 213, or the like.

The conductive adhesive 213 may be a paste containing a conductive metal and an epoxy resin, but is not necessarily limited thereto.

Referring to FIG. 6, in a case of coupling the multilayer ceramic capacitor 100 and the ceramic chip 200 using the high-melting point solder, the conductive adhesive 213, or the like, the conductive paste 213 may be applied onto the lower surfaces of the first and second external electrodes 131 and 132 to thereby be adhered to the first and second terminal electrodes 231 and 232 of the ceramic chip 200.

The high-melting point solder or the conductive adhesive 213 may be applied onto the lower surfaces of the first and second external electrodes 131 and 132 to thereby be fixed to the ceramic chip 200 at the lower surface of the multilayer ceramic capacitor 100, such that only vibration of the surface (LW surface) of the first ceramic body 110 in the length-width direction may be transferred to the ceramic chip 200.

Therefore, the transferring of stress and vibration generated in the multilayer ceramic capacitor 100 to the ceramic chip 200 may be significantly decreased, such that acoustic noise may be decreased.

Figure 7:
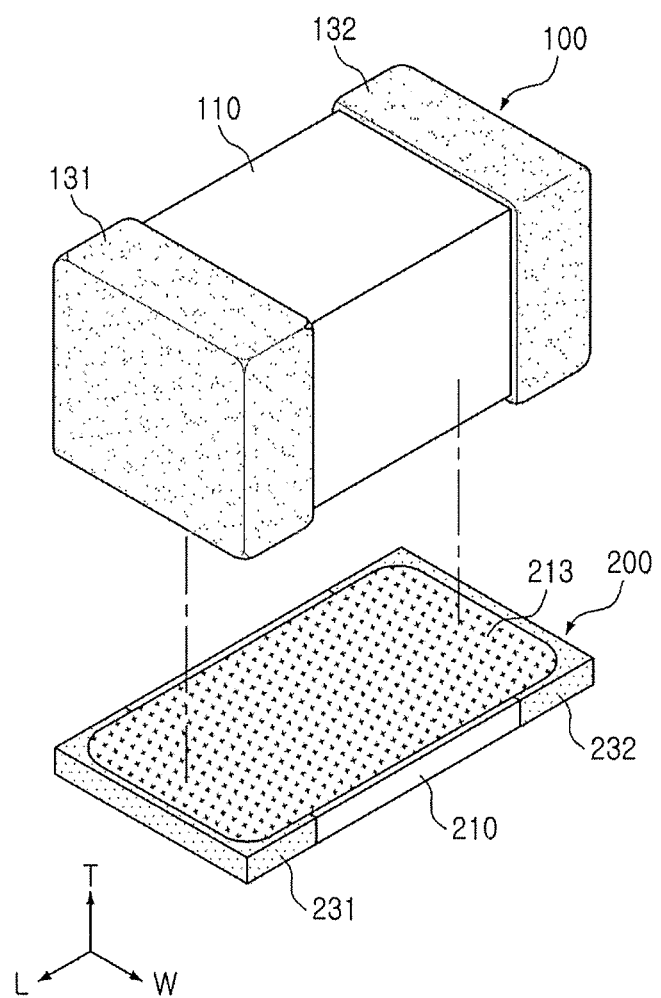
FIG. 7 is an exploded perspective view separately illustrating a multilayer ceramic capacitor and a ceramic chip of another example of the composite electronic component of FIG. 1.

FIG. 7 is an exploded perspective view separately illustrating a multilayer ceramic capacitor and a ceramic chip of another example of the composite electronic component of FIG. 1.

Referring to FIG. 7, the high-melting point solder or the conductive adhesive 213 may be applied to the entire upper surface of the ceramic chip 200, which is an adhesion surface thereof adhered to the multilayer ceramic capacitor 100, to thereby be fixed to the ceramic chip 200 at the lower surface of the multilayer ceramic capacitor 100.

In a case in which the conductive adhesive 213 is applied to the entire upper surface of the ceramic chip 200, the adhesion surface of the ceramic chip 200 adhered to the multilayer ceramic capacitor 100, as described above, the effect of decreasing acoustic noise may be more excellent due to elasticity of the conductive adhesive 213.

Further, since the adhesive is applied to the entire adhesion surface, at the time of mounting the composite electronic component in a board, binding strength of the composite electronic component may be improved, such that reliability may be improved.

Figure 8:
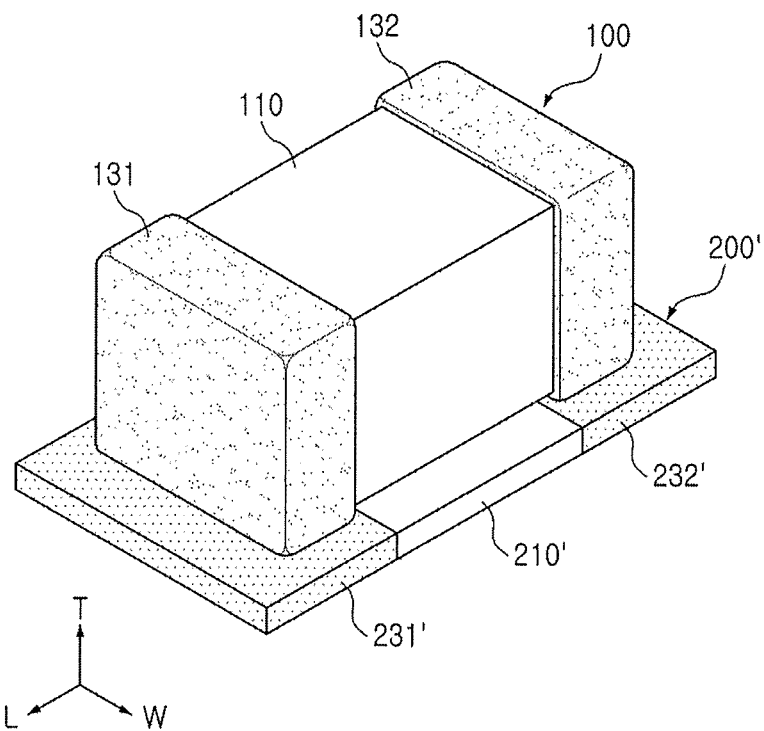
FIG. 8 is a perspective view schematically illustrating a composite electronic component according to a fifth exemplary embodiment.

FIG. 8 is a perspective view schematically illustrating a composite electronic component according to a fifth exemplary embodiment.

Referring to FIG. 8, in the composite electronic component according to the fifth exemplary embodiment, a length of a ceramic chip 200' may be different (e.g., longer) than that of a multilayer ceramic capacitor 100, and/or a width of the ceramic chip 200' may be different (e.g., wider) than that of the multilayer ceramic capacitor 100.

The ceramic chip 200' may include a second ceramic body 210' formed of a ceramic material and first and second terminal electrodes 231' and 232' disposed on both end portions of the second ceramic body 210' and connected to first and second external electrodes 131 and 132.

Since the length of the ceramic chip 200' is longer than that of the multilayer ceramic capacitor 100, and the width of the ceramic chip 200' is wider than that of the multilayer ceramic capacitor 100, at the time of mounting the composite electronic component on a printed circuit board, the ceramic chip 200' may serve to block a solder from being connected from the printed circuit board up to the multilayer ceramic capacitor 100 in length and width directions of the multilayer ceramic capacitor 100.

Therefore, the transferring of vibration to the printed circuit board by the solder may be further decreased.

Figure 9:
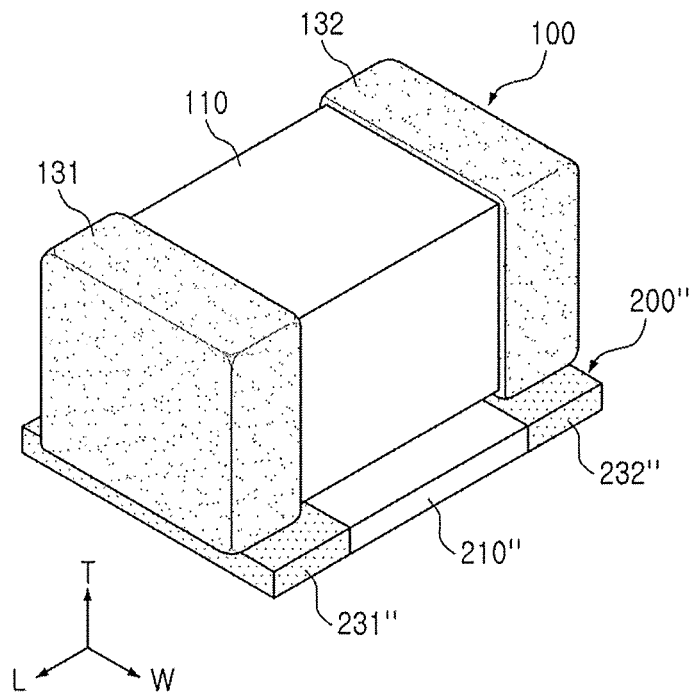
FIG. 9 is a perspective view schematically illustrating a composite electronic component according to a sixth exemplary embodiment.

FIG. 9 is a perspective view schematically illustrating a composite electronic component according to a sixth exemplary embodiment.

Referring to FIG. 9, in the composite electronic component according to the sixth exemplary embodiment, a length of a ceramic chip 200" may be shorter than that of a multilayer ceramic capacitor 100, and a width of the ceramic chip 200" may be wider than that of the multilayer ceramic capacitor 100.

The ceramic chip 200" may include a second ceramic body 210" formed of a ceramic material and first and second terminal electrodes 231" and 232" disposed on both end portions of the second ceramic body 210" and connected to first and second external electrodes 131 and 132.

Since the length of the ceramic chip 200" is shorter than that of the multilayer ceramic capacitor 100, and the width of the ceramic chip 200" is wider than that of the multilayer ceramic capacitor 100, at the time of mounting the composite electronic component on a printed circuit board, the ceramic chip 200" may serve to allow a solder to be applied only up to lower surfaces of the first and second external electrodes 131 and 132 in a length direction of the multilayer ceramic capacitor 100 and block the solder from being connected up to end or side surfaces of the multilayer ceramic capacitor 100 due to a step in a width direction thereof.

That is, since the length of the second ceramic chip 200" is shorter than that of the multilayer ceramic capacitor 100, a so-called solder pocket blocking the solder from rising up to the first and second external electrodes 131 and 132 in the length direction of the multilayer ceramic capacitor 100 may be formed.

In this structure, at the time of mounting the composite electronic component on a printed circuit board, the solder may be applied only up to the lower surfaces of the first and second external electrodes 131 and 132 in the length direction of the multilayer ceramic capacitor 100.

Therefore, the transferring of vibration to the printed circuit board by the solder may be further decreased.

Figure 10:
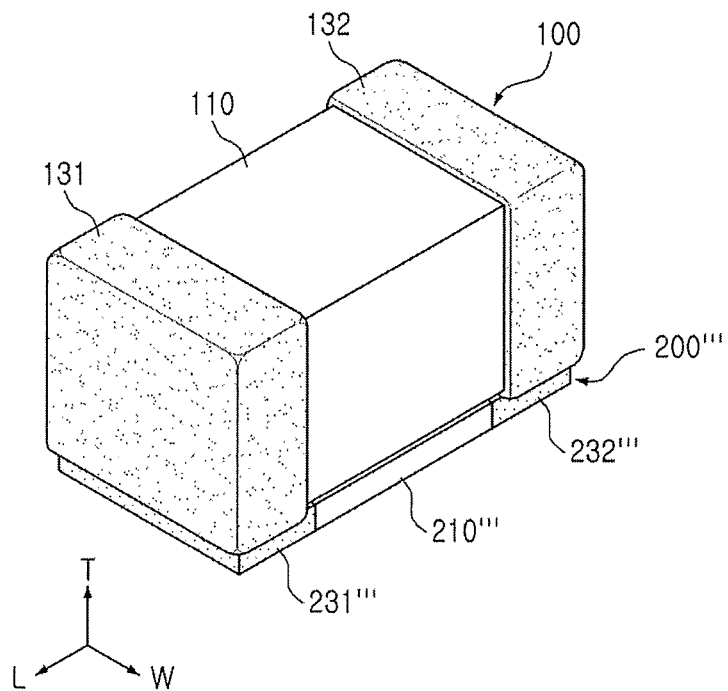
FIG. 10 is a perspective view schematically illustrating a composite electronic component according to a seventh exemplary embodiment.

FIG. 10 is a perspective view schematically illustrating a composite electronic component according to a seventh exemplary embodiment.

Referring to FIG. 10, in the composite electronic component according to the seventh exemplary embodiment, a length of a ceramic chip 200'" may be shorter than that of a multilayer ceramic capacitor 100, and a width of the ceramic chip 200'" may be narrower than that of the multilayer ceramic capacitor 100.

The ceramic chip 200'" may include a second ceramic body 210'" formed of a ceramic material and first and second terminal electrodes 231'" and 232'" disposed on both end portions of the second ceramic body 210'" and connected to first and second external electrodes 131 and 132.

Since the length of the ceramic chip 200'" is shorter than that of the multilayer ceramic capacitor 100, and the width of the ceramic chip 200'" is narrower than that of the multilayer ceramic capacitor 100, at the time of mounting the composite electronic component on a printed circuit board, the ceramic chip 200'" may serve to allow the solder to be applied only up to lower surfaces of the first and second external electrodes 131 and 132 in length and width directions of the multilayer ceramic capacitor 100, and block the solder from being connected up to end or side surfaces of the multilayer ceramic capacitor 100 in a thickness direction thereof.

Therefore, the transferring of vibration to the printed circuit board by the solder may be further decreased.

Board Having Composite Electronic Component

Figure 11:
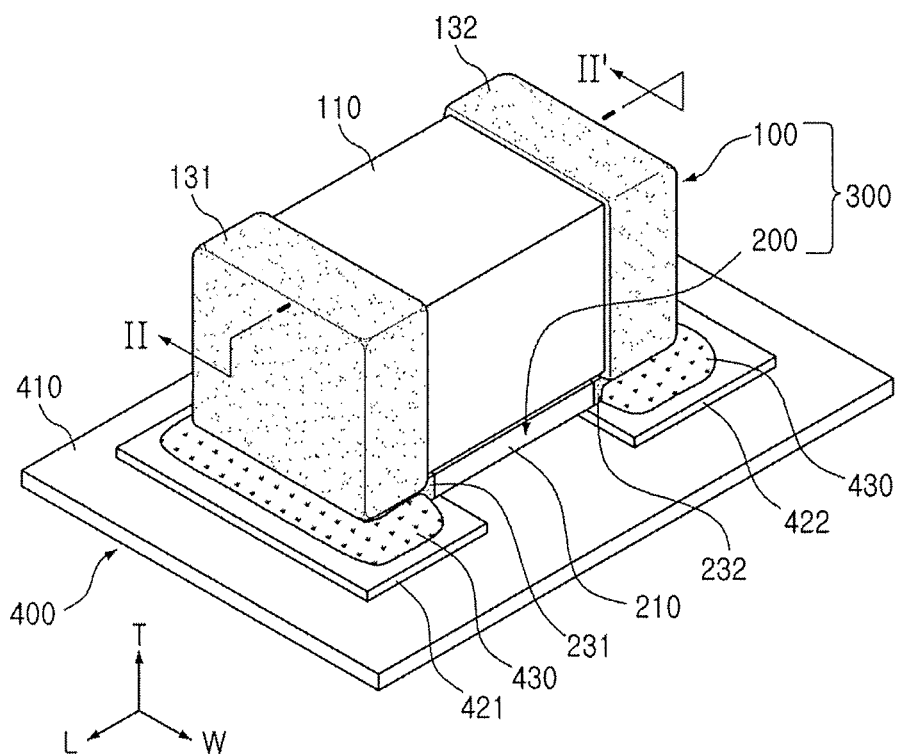
FIG. 11 is a perspective view illustrating a board in which the composite electronic component of FIG. 1 is mounted on a printed circuit board.

FIG. 11 is a perspective view illustrating a board in which the composite electronic component of FIG. 1 is mounted on a printed circuit board.

Figure 12:
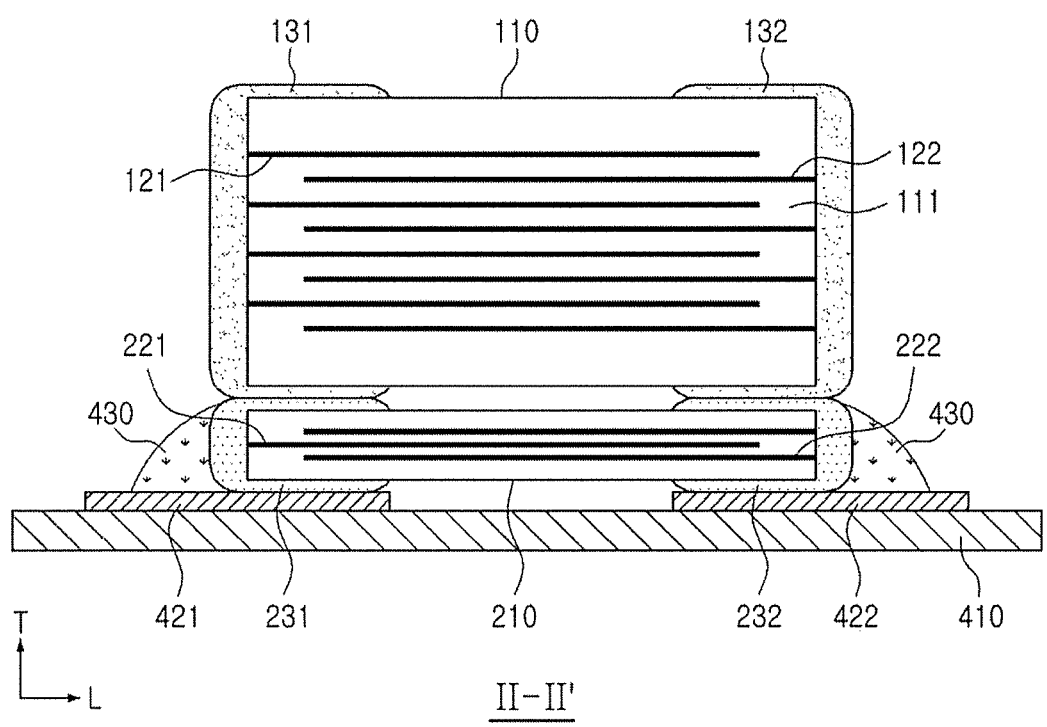
FIG. 12 is a cross-sectional view taken along line II-II' of FIG. 11.

FIG. 12 is a cross-sectional view taken along line II-II' of FIG. 11.

Referring to FIGS. 11 and 12, a board 400 having a composite electronic component according to the present exemplary embodiment may include a printed circuit board 410 on which the composite electronic component is mounted and two electrode pads 421 and 422 formed on an upper surface of the printed circuit board 410.

The electrode pads 421 and 422 may be composed of first and second electrode pads 421 and 422 connected to the first and second terminal electrodes 231 and 232 of the ceramic chip 200 of the composite electronic component 300, respectively.

In this case, the first and second terminal electrodes 231 and 232 of the ceramic chip 200 may be electrically connected to the printed circuit board 410 by solder 430 in a state in which first and second terminal electrodes 231 and 232 are positioned to contact the first and second electrode pads 421 and 422, respectively.

When a voltage is applied in a state in which the composite electronic component is mounted on the printed circuit board 410 as described above, acoustic noise may be generated.

That is, when voltages having different or varying polarities are applied to the first and second external electrodes 131 and 132 disposed on both end surfaces of the multilayer ceramic capacitor 100 of the composite electronic component in the length direction in a state in which the composite electronic component 300 is mounted on the printed circuit board 410, the first ceramic body 110 may be expanded and contracted in the thickness direction by an inverse piezoelectric effect of the dielectric layer(s) 111, and both side portions of the first and second external electrodes 131 and 132 may be contracted and expanded by a Poisson effect in opposition to expansion and contraction of the first ceramic body 110 in the thickness direction.

Here, in the composite electronic component according to the exemplary embodiment, the ceramic chip 200 may be disposed on the lower portion of the multilayer ceramic capacitor 100, such that at the time of mounting the composite electronic component on the printed circuit board, a problem that the solder 430 rises up to the first and second external electrodes 131 and 132 of the multilayer ceramic capacitor 100 may be prevented, thereby blocking piezoelectric stress from being directly transferred from the multilayer ceramic capacitor 100 to the printed circuit board 410 through the solder 430 contacting the first and second external electrodes 131 and 132. Therefore, acoustic noise may be further decreased.

That is, at the time of mounting the composite electronic component 300 on the printed circuit board 410, the transferring of vibrations of the capacitor due to the inverse piezoelectric property of the capacitor to the printed circuit board may be decreased, such that acoustic noise may be decreased.

Further, referring to FIG. 12, in the composite electronic component 300 according to the exemplary embodiment, the ceramic chip 200 may be disposed on the lower portion of the multilayer ceramic capacitor 100 in order to decrease acoustic noise, but the plurality of electrodes 221 and 222 may be disposed in the second ceramic body 210, such that a current path may be shortened, thereby decreasing acoustic noise without an increase in ESL.

More specifically, the plurality of electrodes 221 and 222 may be composed of the first electrode (s) 221 connected to the first terminal electrode 231 of the ceramic chip 200 and the second electrode(s) 222 connected to the second terminal electrode 232.

The first electrode (s) 221 may be exposed to one surface of the second ceramic body 210, more specifically, one end surface thereof in the length direction, to thereby be connected to the first terminal electrode 231, and the second electrode(s) 222 may be exposed to the other surface of the second ceramic body 210, more specifically, the second end surface thereof in the length direction, to thereby be connected to the second terminal electrode 232.

The first and second terminal electrodes 231 and 232 of the ceramic chip 200 may be connected to the first and second external electrodes 131 and 132 of the multilayer ceramic capacitor 100, respectively.

According to the related art, there is a problem in that when an alternating current voltage is applied, since a current path is extended by a distance corresponding to a thickness of an intermediate printed circuit board used for vibration attenuation, equivalent series inductance (ESL) is increased. However, according to the exemplary embodiment, since the current path is formed along the first and second electrodes 221 and 222 disposed in the ceramic chip 200 mounted on a printed circuit board while directly coming in contact with a mounting surface of the printed circuit board, acoustic noise may be decreased without an increase in ESL, unlike the composite electronic component according to the related art.

Hereafter, although the present disclosure will be described in detail with reference to various Inventive Examples, the present disclosure is not limited thereto.

Experimental Example

Composite electronic components according to Inventive Examples and Comparative Examples were manufactured as follows.

Comparative Example 1 is a reference example for comparing acoustic noise levels and ESL values of the composite electronic components according to the Inventive Example and Comparative Example. In Comparative Example 1, only a multilayer ceramic capacitor was manufactured as a single component without disposing a ceramic chip on a lower portion of the multilayer ceramic capacitor.

In Comparative Examples 2 to 5 corresponding to composite electronic components according to Comparative Examples detailed in the present disclosure, a ceramic chip was disposed on a lower portion of a multilayer ceramic capacitor but electrodes were not inserted in the ceramic chip.

More specifically, in Comparative Example 2, the ceramic chip was manufactured at a thickness of 0.2 mm, in Comparative Example 3, the ceramic chip was manufactured at a thickness of 0.4 mm, in Comparative Example 4, the ceramic chip was manufactured at a thickness of 0.6 mm, and in Comparative Example 5, the ceramic chip was manufactured at a thickness of 0.8 mm.

In Inventive Examples 1 to 6 corresponding to composite electronic components according to the exemplary embodiments, a ceramic chip was disposed on a lower portion of a multilayer ceramic capacitor and electrodes were inserted in the ceramic chip.

More specifically, in Inventive Example 1, the ceramic chip was manufactured at a thickness of 0.2 mm, in Inventive Example 2, the ceramic chip was manufactured at a thickness of 0.4 mm, in Inventive Example 3, the ceramic chip was manufactured at a thickness of 0.6 mm, and in Inventive Example 4, the ceramic chip was manufactured at a thickness of 0.8 mm.

Meanwhile, in Inventive Examples 5 and 6, via electrodes formed to penetrate first and second electrodes, respectively, were additionally included in the composite electronic component in which the ceramic chip was disposed on the lower portion of the multilayer ceramic capacitor and the electrodes were inserted in the ceramic chip.

More specifically, in Inventive Example 5, the ceramic chip was manufactured at a thickness of 0.4 mm, and in Inventive Example 6, the ceramic chip was manufactured at a thickness of 0.6 mm.

The following Table 1 illustrates results obtained by measuring acoustic noise levels (dBA) and equivalent series inductance (ESL) values (pH) of samples in Comparative Examples 1 to 5 and Inventive Examples 1 to 6 in a state in which each of the samples was mounted on a printed circuit board.

TABLE 1

| | Acoustic Noise (dBA) | ESL (pH) |
| --- | --- | --- |
| Comparative Example 1 | 45.2 | 284 |
| Comparative Example 2 | 35.2 | 553 |
| Comparative Example 3 | 32.6 | 862 |
| Comparative Example 4 | 30.1 | 1008 |
| Comparative Example 5 | 29.8 | 1220 |
| Inventive Example 1 | 36.1 | 324 |
| Inventive Example 2 | 33.1 | 335 |
| Inventive Example 3 | 30.8 | 362 |
| Inventive Example 4 | 28.5 | 355 |
| Inventive Example 5 | 33.2 | 225 |
| Inventive Example 6 | 30.5 | 244 |

Referring to Table 1, in Comparative Example 1 in which a general multilayer ceramic capacitor was mounted on a printed circuit board, the acoustic noise level and ESL value were measured to be 45.2 dBA and 284 pH, respectively.

On the other hand, in Comparative Examples 2 to 5, the acoustic noise levels were 35.2, 32.6, 30.1, and 29.8, respectively. Therefore, it may be appreciated that the acoustic noise was decreased as compared to Comparative Example 1. On the contrary, the measured ESL values were 553, 862, 1008, and 1220. Therefore, it may be appreciated that the ESL was significantly increased as compared to Comparative Example 1 in which the multilayer ceramic capacitor was mounted. It may be appreciated that as the thickness of the ceramic chip was increased, the ESL was also increased, and the reason may be that as the thickness of the ceramic chip was increased, a current path was extended. In a case of disposing a ceramic chip on a lower portion of a multilayer ceramic capacitor in order to decrease acoustic noise, which is a problem at the time of mounting the multilayer ceramic capacitor alone on a printed circuit board according to the related art, there is a problem in that ESL may be increased.

On the contrary, in Inventive Examples 1 to 6 according to the present disclosure, the acoustic noise levels were 36.1, 33.1, 30.8, 28.5, 33.2, and 30.5, respectively, and the ESL values were 324, 335, 362, 355, 225, and 244, respectively. Therefore, it may be appreciated that the acoustic noise was decreased with no notable increase in ESL value.

Particularly, in Inventive Examples 5 and 6 in which the via electrodes penetrating through the first and second electrodes were further included in the composite electronic component in which the electrodes were inserted in the ceramic chip, the equivalent series inductance (ESL) value was decreased by 20% or more as compared to a case in which only the multilayer ceramic capacitor was mounted on the printed circuit board, and at the same time, acoustic noise was also decreased.

As set forth above, according to exemplary embodiments presented in the present disclosure, stress or vibrations due to the piezoelectric property of the multilayer ceramic capacitor may be alleviated by the ceramic chip, such that the acoustic noise generated in the printed circuit board may be decreased.

At the same time, in the composite electronic component according to the related art in which the ceramic chip is disposed on the lower portion of the multilayer ceramic capacitor, a side effect that ESL is increased may occur. However, according to the embodiments presented in the present disclosure, the current path may be shortened by inserting the electrodes in the ceramic chip disposed on the lower portion of the multilayer ceramic capacitor, such that acoustic noise may be decreased without an increase in ESL.

Further, the current path may be further shortened by inserting the via electrodes penetrating through the electrodes, respectively, in addition to inserting the electrodes in the ceramic chip, such that ESL may be further decreased.

Further, the internal electrodes of the multilayer ceramic capacitor may be stacked to extend perpendicularly to the mounting surface of the composite body, such that the surface of the first ceramic body in the length-width direction of which a piezoelectric displacement amount is small may be adhered to the ceramic chip, and such that the transferring of stress and vibration generated in the multilayer ceramic capacitor to the ceramic chip may be significantly decreased, thereby decreasing acoustic noise.

In addition, a step may be formed between the multilayer ceramic capacitor and the ceramic chip, such that the transferring of vibration to the printed circuit board by solder may be significantly decreased by blocking the solder from being formed or extending in the thickness direction of the multilayer ceramic capacitor.

While exemplary embodiments have been shown and described above, it will be apparent to those skilled in the art that modifications and variations could be made without departing from the scope of the present invention as defined by the appended claims.

What is claimed is:
1. A composite electronic component comprising:
   a composite body comprising:
      a multilayer ceramic capacitor including a first ceramic body in which a plurality of dielectric layers and internal electrodes disposed to face each other with respective dielectric layers interposed therebetween are stacked, and first and second external electrodes disposed on both end portions of the first ceramic body; and
      a ceramic chip coupled to the multilayer ceramic capacitor, the ceramic chip being disposed on a lower portion of the multilayer ceramic capacitor and including a second ceramic body and first and second terminal electrodes disposed on both end portions of the second ceramic body and connected to the first and second external electrodes, respectively,
   wherein a plurality of electrodes are disposed in the second ceramic body so as to be disposed closer to a first surface of the second ceramic body than to a second surface of the second ceramic body opposite the first surface and on which the multilayer ceramic capacitor is coupled.

2. The composite electronic component of claim 1, herein the second ceramic body contains a paraelectric material.

3. The composite electronic component of claim 1, wherein the internal electrodes in the first ceramic body are stacked to be perpendicular to a surface of the first ceramic body on which the ceramic chip is coupled.

4. The composite electronic component of claim 1, wherein the plurality of electrodes disposed in the second ceramic body includes a first planar electrode connected to the first terminal electrode, and a second planar electrode connected to the second terminal electrode and overlapping the first planar electrode in a stacking direction perpendicular to the first and second planar electrodes.

5. The composite electronic component of claim 1, wherein the plurality of electrodes in the second ceramic body includes a first electrode connected to the first terminal electrode and a second electrode connected to the second terminal electrode, and
   the ceramic chip further includes a first via electrode penetrating through the first electrode to thereby be connected to the first terminal electrode and a second via electrode penetrating through the second electrode to thereby be connected to the second terminal electrode.

6. The composite electronic component of claim 1, wherein the multilayer ceramic capacitor and the ceramic chip are coupled to each other by a conductive adhesive applied to surfaces of the first and second external electrodes that face the ceramic chip.

7. The composite electronic component of claim 1, wherein the multilayer ceramic capacitor and the ceramic chip are coupled to each other by a conductive adhesive applied to an entire adhesion surface of the ceramic chip that faces the multilayer ceramic capacitor.

8. The composite electronic component of claim 1, wherein a length of the ceramic chip, in a length direction extending between the end portions on which the first and second terminal electrodes are disposed, is longer than a length of the multilayer ceramic capacitor in the length direction.

9. The composite electronic component of claim 8, wherein a width of the ceramic chip, in a width direction perpendicular to the length direction, is wider than a width of the multilayer ceramic capacitor in the width direction.

10. The composite electronic component of claim 1, wherein a length of the ceramic chip, in a length direction extending between the end portions on which the first and second terminal electrodes are disposed, is shorter than a length of the multilayer ceramic capacitor in the length direction.

11. The composite electronic component of claim 1, wherein a length of the ceramic chip, in a length direction extending between the end portions on which the first and second terminal electrodes are disposed, is shorter than a length of the multilayer ceramic capacitor in the length direction, and a width of the ceramic chip, in a width direction perpendicular to the length direction, is narrower than a width of the multilayer ceramic capacitor in the width direction.

12. A board having a composite electronic component, the board comprising:
   a printed circuit board on which a plurality of electrode pads are disposed;
   the composite electronic component of claim 1 mounted on the printed circuit board; and
   a solder connecting the electrode pads and the composite electronic component to each other.

13. The board of claim 12, wherein the second ceramic body contains a paraelectric material.

14. The board of claim 12, wherein the internal electrodes in the first ceramic body are stacked to be perpendicular to a mounting surface of the composite body that faces the printed circuit board.

15. The board of claim 12, wherein the first surface of the second ceramic body functions as a mounting surface of the second ceramic body that faces the printed circuit board.

16. The board of claim 12, wherein the plurality of electrodes in the second ceramic body includes a first electrode connected to the first terminal electrode and a second electrode connected to the second terminal electrode, and
   the ceramic chip further includes a first via electrode penetrating through the first electrode to thereby be connected to the first terminal electrode and a second via electrode penetrating through the second electrode to thereby be connected to the second terminal electrode.

17. The board of claim 12, wherein the ceramic chip is disposed between the printed circuit board and the multilayer ceramic capacitor.

18. A composite electronic component comprising:
   a multilayer ceramic capacitor comprising first and second internal electrodes alternately stacked to overlap with each other in a ceramic body; and
   a ceramic chip having the multilayer ceramic capacitor mounted to a second surface thereof, the ceramic chip comprising a plurality of planar electrodes that are disposed therein, are overlapping with each other, and are disposed closer to a first surface of the ceramic chip than to the second surface of the ceramic chip opposite the first surface,
   wherein the composite electronic component has a mounting surface for mounting to a printed circuit board, and the mounting surface is the first surface of the ceramic chip that is disposed opposite the second surface of the ceramic chip on which the multilayer ceramic capacitor is mounted.

19. The composite electronic component of claim 18, wherein the composite electronic component comprises first and second terminal electrodes disposed on the mounting surface thereof,
   the plurality of planar electrodes of the ceramic chip comprises first and second planar electrodes overlapping with each other in a stacking direction, and
   the first terminal electrode is electrically connected to the first planar electrode of the ceramic chip and the first internal electrodes of the multilayer ceramic capacitor, and the second terminal electrode is electrically connected to the second planar electrode of the ceramic chip and the second internal electrodes of the multilayer ceramic capacitor.

20. The composite electronic component of claim 19, wherein the multilayer ceramic capacitor comprises first and second external electrodes disposed on opposing end portions of the ceramic body and respectively connected to the first and second internal electrodes, and
   the ceramic chip comprises first and second terminal electrodes disposed on the mounting surface of the composite electronic component and respectively connected to the first and second external electrodes of the multilayer ceramic capacitor.

21. The composite electronic component of claim 18, wherein the first and second internal electrodes of the multilayer ceramic capacitor are orthogonal to the planar electrodes of the ceramic chip.

22. The composite electronic component of claim 18, wherein the first and second internal electrodes of the multilayer ceramic capacitor are exposed to respective opposite surfaces of the ceramic body in a length direction, and
   the ceramic chip has a length, measured in the length direction, different from a length of the multilayer ceramic capacitor, measured in the length direction.

23. The composite electronic component of claim 18, wherein the first and second internal electrodes of the multilayer ceramic capacitor are exposed to respective opposite surfaces of the ceramic body in a length direction, and
   the ceramic chip has a width, measured in a width direction orthogonal to the length direction, different from a width of the multilayer ceramic capacitor, measured in the width direction.

* * * * *